United States Patent [19]

Lincoln et al.

[11] Patent Number: 5,108,785
[45] Date of Patent: Apr. 28, 1992

[54] VIA FORMATION METHOD FOR MULTILAYER INTERCONNECT BOARD

[75] Inventors: Thomas S. Lincoln, Arvada; Charles E. Bauer, Evergreen, both of Colo.

[73] Assignee: Microlithics Corporation, Golden, Colo.

[21] Appl. No.: 408,120

[22] Filed: Sep. 15, 1989

[51] Int. Cl.⁵ .............................................. C23C 26/00
[52] U.S. Cl. ..................................... 427/96; 427/97; 427/53.1
[58] Field of Search ........................... 427/96, 97, 53.1

[56] References Cited

U.S. PATENT DOCUMENTS

| | | |
|---|---|---|
| 4,211,603 | 7/1980 | Reed . |
| 4,258,468 | 3/1981 | Balde ..................... 427/97 |
| 4,288,530 | 9/1981 | Bedard ................... 427/96 |
| 4,453,176 | 6/1984 | Chance et al. . |
| 4,489,364 | 12/1984 | Chance et al. . |
| 4,566,186 | 1/1986 | Bauer et al. . |
| 4,642,160 | 2/1987 | Burgess . |
| 4,720,322 | 1/1988 | Tiffin . |
| 4,803,450 | 2/1989 | Burgess et al. . |
| 4,823,136 | 4/1989 | Nathanson et al. . |
| 4,827,610 | 5/1989 | Williams et al. . |
| 4,829,014 | 5/1989 | Yerman . |
| 4,829,018 | 5/1989 | Wahlstrom . |
| 4,830,264 | 5/1989 | Bitaillou et al. . |
| 4,830,706 | 5/1989 | Horwath et al. . |
| 4,931,134 | 6/1990 | Hatkevitz ............... 427/96 |
| 4,931,323 | 6/1990 | Manitt .................... 427/96 |

Primary Examiner—Shrive Beck
Assistant Examiner—Vi Duong Dang
Attorney, Agent, or Firm—Sheridan, Ross & McIntosh

[57] ABSTRACT

A method of boring holes in a circuit board assembly of the type having a first layer of material which is primarily reflective of light of a first light wavelength and having a second layer of material, overlying the first layer of material, which is primarily absorptive of light of the first light wavelength, comprising: tuning the frequency of a laser cutting device to the first light wavelength; directing a laser beam from the tuned laser cutting device onto the second layer of material in a region where a hole is to be provided; and terminating application of the laser beam after a hole has been bored through the second layer of material.

9 Claims, 5 Drawing Sheets

VIA FORMATION METHOD FOR MULTILAYER INTERCONNECT BOARD

BACKGROUND OF THE INVENTION

The present invention relates generally to the production of ceramic substrate, glass-based, multilayer interconnect boards and, more particularly, to a method of producing such multilayer interconnect boards which utilizes laser drilling for via formation.

Ceramic substrate, glass-based, multilayer interconnect boards, generally referred to in the industry as "ceramic MIBs" or simply "MIBs" and generally referred to herein a "glass-based MIBs", are high-density printed circuit devices which are more reliable in wet environments and under elevated temperature conditions than ordinary printed circuit boards. Glass-based MIBs are particularly adapted for military applications and other applications in which high reliability, even under harsh conditions, is critical. A ceramic MIB, like an ordinary printed circuit board, comprises a plurality of interconnected circuit elements which are arranged in stacked conductor layers. Each conductor layer is separated from an adjacent conductor layer by a dielectric layer. Holes or "vias" are provided through the dielectric layers to enable connection of conductor layers.

Ordinary printed circuit boards typically employ alternating conductive layers and dielectric layers. Each conductive layer of a conventional printed circuit board typically comprises a pure metal, such as copper, which is laminated onto the surface of an underlying layer and subsequently subtractively processed (etched) into a predetermined conductor pattern. Such a conductor pattern typically has line widths and line spacing on the order of 10 mils (0.01 in.) or 250 microns (0.25 mm). Dielectric layers of ordinary printed circuit boards are typically epoxy/glass based such as FR-4 (IPC Standard) and have layer thicknesses on the order of 0.7 to 10 mils (15 to 250 microns). Laser drilling is a known method used in conventional printed circuit board production for providing holes through dielectric layers to enable connection of conductive layers. See, e.g., U.S. Pat. No. 4,829,014 of Yerman, which is hereby specifically incorporated by reference for all that is disclosed therein.

Glass-based MIBs differ from conventional printed circuit boards both in physical scale and in material composition. Glass-based MIBs comprise a high-strength, heat-resistant ceramic substrate layer which is typically aluminum oxide ($Al_2O_3$). Conductive layers are provided by a conductive material comprising metal particles bound by a glass matrix. A conductive pattern is typically provided by silk-screen printing of the conductive material onto the surface of an underlying layer. Typical conductor pattern line width and line spacing in a glass-based MIB is on the order of 5 to 10 mils (125 to 250 microns). Each dielectric layer is also formed from a glass matrix material typically having a total layer thickness on the order of 1 to 4 mils (25 to 100 microns). Due to the fact that each conductor pattern in a glass-based MIB is, like each dielectric layer therein, formed from a glass matrix material, lasers have heretofore not been used to form vias in glass-based MIBs. It has been the general belief in the industry that any laser drilling of the dielectric layer would necessarily damage the underlying conductive layer since the two layers both comprise a glass matrix. This problem is not experienced in the laser drilling of vias for ordinary circuit boards where the underlying entirely-metal conductive layer is much more resistant to laser energy than the overlying layer of epoxy-based dielectric.

As a result of this prevailing view regarding the inapplicability of laser drilling of vias for glass-based MIBs, it is the present practice in the industry to provide vias through an exacting and expensive registration process.

FIGS. 1–3 illustrate a prior art via-forming technique which is currently used throughout the glass-based MIB fabrication industry.

As illustrated in FIG. 1, a substrate layer 10, which is typically a 25 to 60 mils (0.6 to 1.5 mm) thick layer of ceramic material, has a conductive layer 12 applied thereto in a predetermined pattern, typically by silk-screen printing. The screens used in this process are positioned at a preset elevation above the substrate layer and are adapted to elastically yield to a second preset elevation and then spring back to the original elevation in response to the passage of a conductive-material-applying squeegee thereover. The second preset elevation in conjunction with other parameters determines the thickness of the layer which is being applied. The conductor layer 12 has certain regions 13 therein which are adapted to be connected to corresponding regions in other conductive layers. These interconnect regions 13 are generally referred to in the industry as "pads". The substrate and conductive layer subassembly is then transported to a furnace where it is heat-treated or "fired" to cure and solidify the conductive layer 12. This heat-curing process typically takes on the order of 1 hour.

Next, the subassembly 100, FIG. 1, thus formed is returned to the silk-screening table where a discontinuous dielectric layer 14 having via-forming voids 16 positioned above the pad regions 13 is applied and the via-forming voids 16 filled with conductive material 30, in a series of sublayer 20, 22, 24 applications. The via fill conductive material 30 is similar in physical and mechanical properties (in the fired state) to the material used to form the dielectric layers. As illustrated in FIG. 2A, an initial sublayer 20 is applied in a silk-screening printing process. The screen used in the application of the first sublayer has blocked-out regions therein which are adapted to be placed in registry with pad regions 13 in the conductive layer and thus prevent application of dielectric material in overlying relationship with the pad regions 13. After application of the first sublayer 20, the subassembly is dried and transported to a furnace and fired to cure the dielectric material to provide a solidified sublayer. After the application and firing of the first dielectric sublayer 20, the subassembly is then returned to the silk-screening table and the via-forming voids 16 are filled with conductive material 30. Via filling is typically performed by silk-screening, using a reverse-image screen from that used to apply the dielectric sublayers. Next, the subassembly is dried and returned to the furnace and fired to cure the via fill material to provide a solidified via conductor. Next, as illustrated in FIG. 2B, a second dielectric sublayer 22 is applied in the same manner as the first dielectric sublayer, a void being provided therein directly above the pad regions 13 in the conductive layer. The second dielectric sublayer 22 is then dried and fired and the via-forming voids 18 filled, dried and fired in the same manner as the first sublayer 20. The third dielectric sublayer 24 is then applied, dried, fired, filled, dried and fired in the same manner as the second sublayer 22, thus typically completing the formation of the first dielectric layer. The primary reason that the dielectric layer 14 is applied in three successive sublayers is to facilitate creation of vias 30 (FIG. 3). The material from which the dielectric layer 14 is formed is necessarily a thixotropic material, i.e. a gelatin-like material which is capable, when under substantial mechanical shear, of flowing through a screen like a liquid but which, when not under substantial mechanical shear, has surface characteristics which cause it to resist flowing and retain a relatively straight vertical edge at formed peripheral portions thereof such as those associated with vias 16. However, such thixotropic material is, due to the stress associated with its own mass, limited in its capacity to resist lateral fluid flow and maintain an upright vertical edge. The depth of dielectric material which may be applied in a single silk-screening pass while maintaining sharp via definition is therefore limited. The maximum thickness of a dielectric sublayer having well-defined via voids therein is typically 0.7 to 1.5 mils (15 to 37 microns). The time required for the silk-screening and firing of each dielectric/via fill sublayer is typically on the order of three hours. Thus, a three-sublayer dielectric layer with via fills typically takes nine hours to complete. A four-sublayer dielectric layer takes proportionately longer.

The next step, as illustrated by FIG. 3, is to apply a second conductive layer pattern 34. The conductive pattern is again typically applied by silk-screening and has certain regions 35 therein which overlie and make conductive contact with the underlying vias 30 to form an electrical connection between the first conductive layer 12 and the second conductive layer 34.

The above-described conductive layer and dielectric layer formation and interconnection process is utilized to form a multilayer interconnect board 36 which has multiple dielectric layers 14, 15, 17, 19 and multiple conductive layers 12, 34, 35, 37 such as illustrated in FIG. 4. The last layer of the circuit board, generally referred to in the industry as the "foot print" layer, comprises a plurality of exposed connector pads 38, 40, etc., which are adapted to be attached to interfacing connectors of other electronic devices.

Although the illustrated glass-based MIB 36 comprises only four dielectric layers, some modern glass-based MIBs have as many as 15 to 24 dielectric layers which require nine hours per layer to apply. The cost associated with the application of dielectric layers typically accounts for about 50% of the total MIB production time. Due to the above described special thixotropic characteristics as well a dielectric characteristics which the fired dielectric material must possess, this material is relatively expensive and accounts for a significant portion, e.g. 60%, of the total material cost of the MIB.

OBJECTS OF THE INVENTION

It is an object of the present invention to provide a method for constructing a glass-based multilayer interconnect board which utilizes laser drilling to provide vias through dielectric layer portions thereof.

It is another object of the present invention to provide a method for constructing a glass-based multilayer interconnect board which utilizes differential reflection of laser light to enable selective laser boring through a first layer of glass matrix material without damage to a second underlying layer of glass matrix material provided in a multilayer interconnect board.

It is another object of the present invention to provide a method for constructing a glass-based multilayer interconnect board which obviates the need for pad registration during application of dielectric layers.

It is another object of the present invention to provide a method for constructing a glass-based multilayer interconnect board which enables application of a dielectric layer in a single pass.

It is another object of the present invention to provide a method for constructing a glass-based multilayer interconnect board which substantially reduces the number of firing steps and thus substantially reduces the production costs for a multilayer interconnect board.

It is another object of the present invention to provide a method for constructing a glass-based multilayer interconnect board which enables the use of less-expensive dielectric material than that which is currently used in the industry.

SUMMARY OF THE INVENTION

The present invention may comprise a method of boring holes in a circuit board assembly of the type having a first layer of material which is primarily reflective of light of a first light wavelength and having a second layer of material, overlying said first layer of material, which is primarily absorptive of light of said first light wavelength, comprising: tuning the wavelength of a laser cutting device to said first light wavelength; directing a laser beam from said tuned laser cutting device onto said second layer of material in a region where a hole is to be provided; and terminating application of the laser beam after a hole has been bored through said second layer of material.

The present invention may also comprise a method for providing a via in a predetermined portion of a multilayer interconnect board comprising the steps of: providing an interconnect board subassembly comprising a layer of conductor material comprising metal particles embedded in a glass matrix and a layer of dielectric material comprising a glass matrix which overlies said layer of conductive material; tuning a laser cutting device to a light wavelength which is primarily reflected by said metal particles in said conductive layer; and directing a laser beam from said tuned laser cutting device onto a selected region of said dielectric layer until a hole is bored through said dielectric layer; wherein the step of providing an interconnect board subassembly comprises applying said dielectric layer in a continuous coating to said conductive layer; and wherein the step of applying said dielectric layer comprise utilizing only a single heating period to cure said dielectric layer.

The present invention may also comprise a method for forming a portion of a multilayer interconnect board comprising the steps of: providing a conductor material comprising copper particles embedded in glass matrix in a ratio of between 75 to 25 copper to glass and 98 to 2 copper to glass, and preferably between 95 to 5 copper to glass and 8 to 2 copper to glass; printing the conductor material in a predetermined first conductor pattern which is typically between 0.5 mils (12.5 microns) thick and 1.5 mils (37.5 microns) thick, but may be up to 4 mils (100 microns) thick, on an underlying layer of material; providing a glass-based dielectric material; covering the conductor pattern with a layer of the dielectric material having a layer thickness of between 0.5 mils (12.5 microns) and 10 mils (250 microns), and preferably 1.5 mils (37.5 microns) to 4 mils (100 microns); tuning a laser cutting device to approximately the same wavelength of light which is reflected from copper; directing light from the laser onto the layer of dielectric material in a region thereof overlying the conductor pattern until a via is bored through the dielectric layer to the conductor pattern; filling the via in the dielectric layer with a conductive material; and providing a second conductor pattern on an exposed surface portion of the layer of dielectric material and in conductive connection with the conductive material in the via.

BRIEF DESCRIPTION OF THE DRAWINGS

An illustrative and presently preferred embodiment of the invention is shown in the accompanying drawings in which.

DETAILED DESCRIPTION OF THE INVENTION

Figure 5:
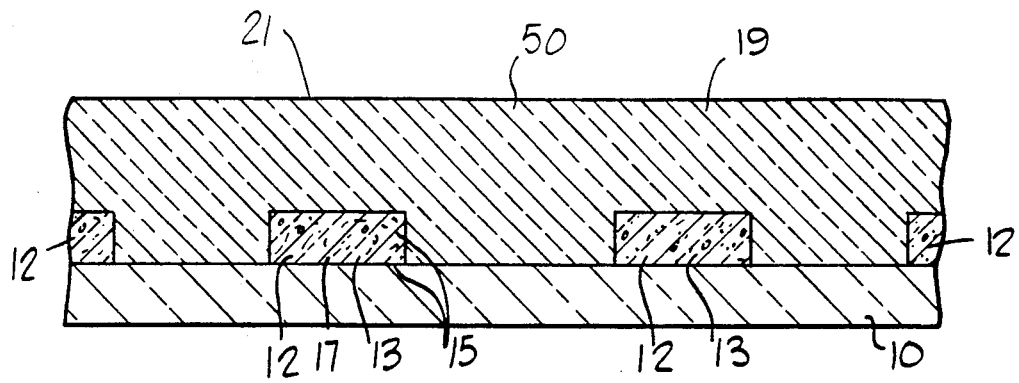
FIG. 5 is a schematic, cross sectional elevation view of a substrate layer, conductor layer, and continuous dielectric layer of a multilayer interconnect board subassembly.
Figure 6:
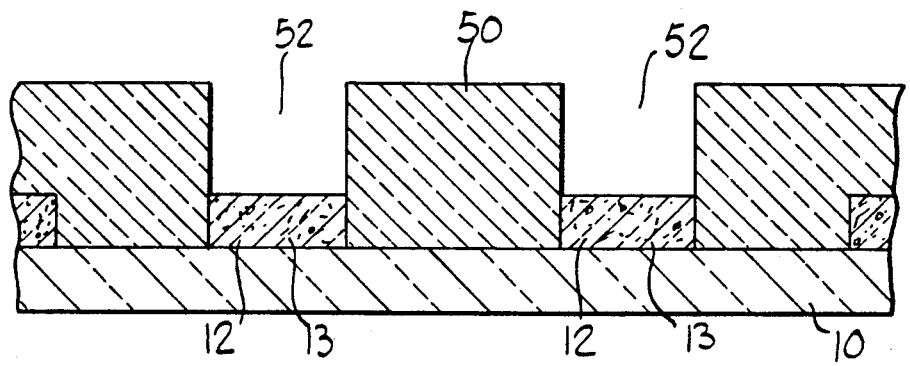
FIG. 6 is a cross sectional elevation view of a substrate layer, conductor layer, and dielectric layer with laser-drilled vias of a multilayer interconnect board subassembly.

The present invention, in general, comprises a method for providing a via 52, FIG. 6, in a predetermined portion of a multilayer interconnect board subassembly. The method includes the step of providing an interconnect board subassembly including a layer of conductor material 12 comprising metal particles 15 bound by a glass matrix 17 and a continuous layer of dielectric material 50 comprising a glass matrix 19 which overlies the layer of conductor material 12, FIG. 5. The method further includes tuning a laser cutting device 80, FIG. 14, to a light wavelength which is reflected by the metal particles 15 in the conductive layer 12. The method also includes directing a laser beam 84 from the tuned laser cutting device 80 onto a selected region 21, FIG. 5, on the dielectric layer 50 until a via hole 52, FIG. 6, is bored through the dielectric layer. Having thus described the method of the present invention in general, the invention will now be described in further detail.

Figure 1:
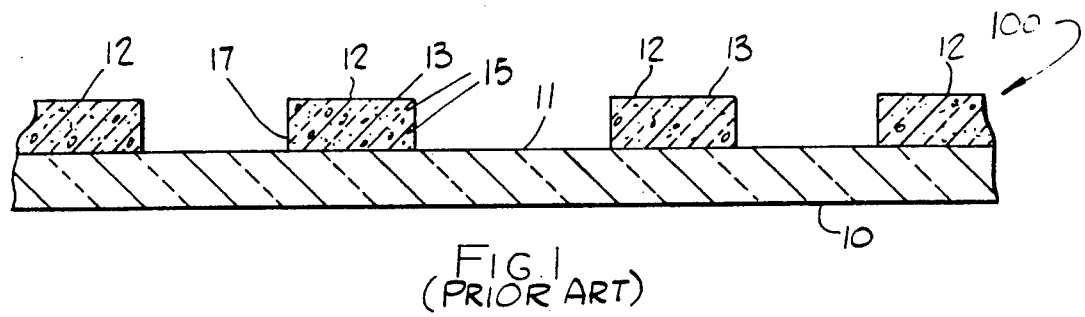
FIG. 1 is a schematic, cross sectional elevation view of a substrate layer and conductor layer of a glass-based multilayer interconnect board subassembly.
Figure 2A:
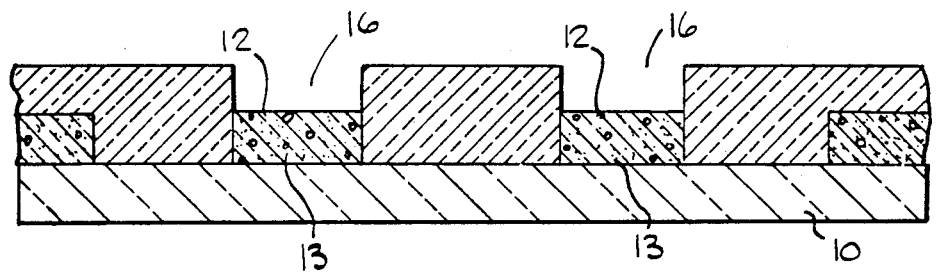
FIG. 2A is a schematic, cross sectional elevation view of a substrate layer, conductor layer, and first sublayer of a first dielectric layer with print-registration-formed vias of a glass-based multilayer interconnect board subassembly.
Figure 2B:
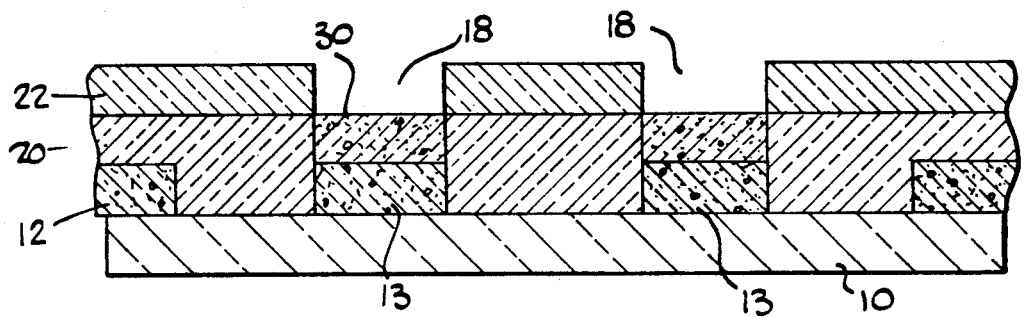
FIG. 2B is a schematic, cross sectional elevation view of a substrate layer, conductor layer, and first and second sublayers of a first dielectric layer with print-registration-formed vias and first sublayer via fill of a glass-based multilayer interconnect board subassembly.
Figure 3:
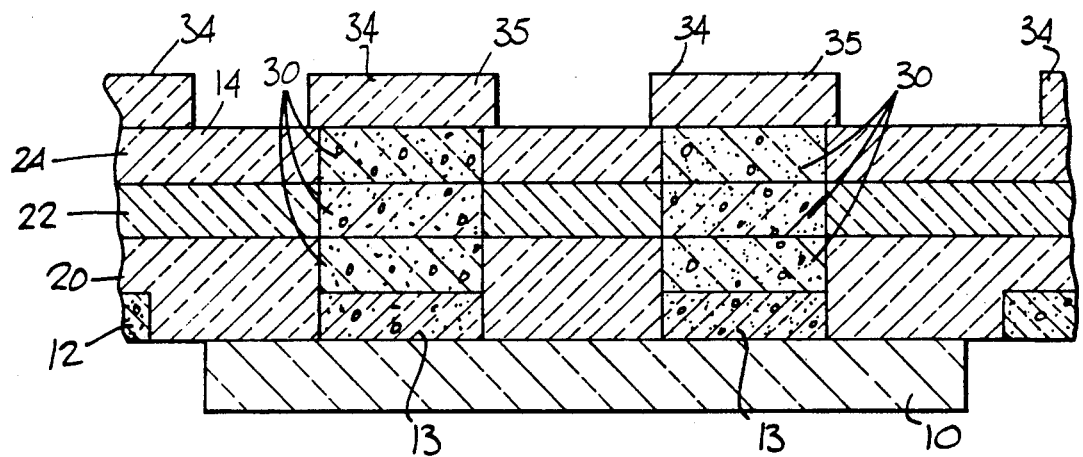
FIG. 3 is a schematic, cross sectional elevation view of a substrate layer, first and second conductor layer and a first dielectric layer with via fill of a glass-based multilayer interconnect board subassembly.
Figure 8:
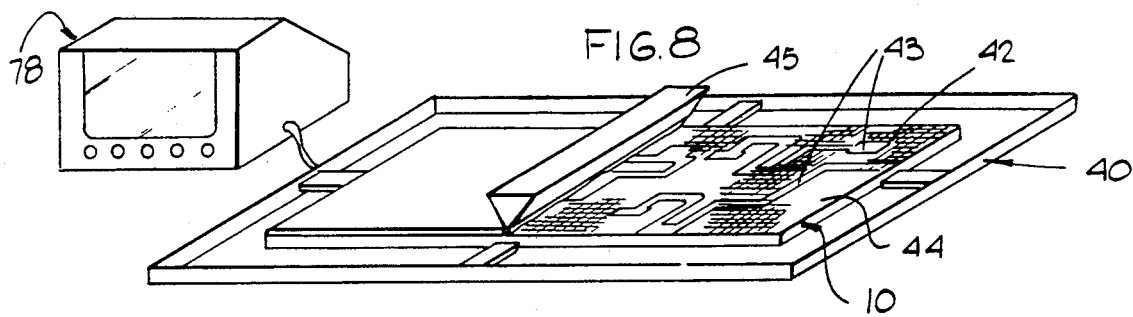
FIG. 8 is a schematic perspective view illustrating the silk-screening of a conductor layer of a glass-based multilayer interconnect board subassembly.
Figure 9:
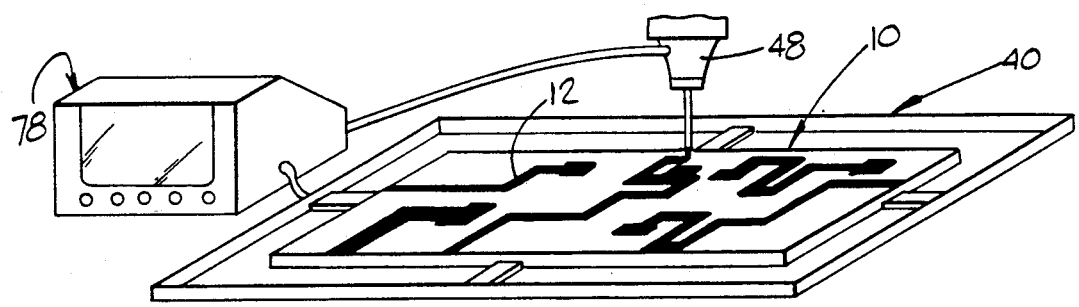
FIG. 9 is a schematic perspective view illustrating the printing of a conductor layer of a glass-based multilayer interconnect board subassembly with a capillary pen device.

As illustrated in FIG. 1, an initial step in forming a multilayer interconnect board 36 comprises applying a conductive layer 12 of a predetermined conductor pattern, e.g. the pattern shown in FIG. 9, onto a planar surface portion 11 of a substrate layer 10 which, in a preferred embodiment, comprises a ceramic substrate layer having a thickness of, e.g., 25 to 60 mils (0.6 to 1.5 mm). The conductor material 12 comprises a glass matrix 17 having metal particles 15 suspended therein. In such a conductive layer, the glass-to-metal ratio is generally in a range of between 95 to 5 metal to glass and 98 to 2 metal to glass by weight. In one preferred embodiment of the invention, the metal particles are copper and the ratio of glass to copper is approximately 98 to 2. The conductive layer 12 is typically 0.7 mils (17.5 microns) thick. One method of applying the conductor layer to the substrate layer 10, which is presently the best mode contemplated, comprises silk-screening the conductive layer 12 onto the substrate layer 10 as illustrated schematically in FIG. 8. A screen 42 having open areas 43 corresponding to the conductor pattern to be printed and having masked areas 44 which define the open areas of the conductor pattern is positioned in overlying relationship with the substrate layer 10. A conventional squeegee device 45 is compressively swept over the screen while pushing a supply of conductive material before it so as to urge conductive material through the open areas 43 of the screen 42. The screen is then removed, leaving a printed pattern of conductive material in the areas underlying the open areas 43 of the screen 42. In a preferred embodiment, the substrate layer 10 is positioned on an XY positioning table 40 which is precisely referenced to the position of screen 42 during the printing process. The position of the conductor pattern of the screen which is printed on the substrate may be stored in the memory of a CAD/CAM system 78 for later use. XY positioning tables are devices adapted to move an object mounted thereon to precise positions within a known plane of reference. XY tables are well-known in the art, as are CAD/CAM systems and software for producing controlled movement of such tables. See, e.g., U.S. Pat. No. 4,829,014 of Yerman, supra. Silk-screening of a conductive paste layer onto a substrate layer is well-known in the art.

In an alternative method, the conductive layer is applied to the substrate layer 10 by a capillary pen 48 which "writes" conductive paste directly onto the surface of the substrate 10 in much the same manner that a conventional fountain pen writes on a sheet of paper. The substrate 10 is preferably mounted on an XY table 40 which is precisely located below a stationary capillary pen 48. The writing of a predetermined conductor configuration is controlled by a CAD system 78 which has the predetermined conductor pattern stored in memory and which displaces the substrate 10 on the XY positioning table 40 to produce the predetermined pattern. In another, slightly modified embodiment of the invention, the substrate 10 is held in a fixed position and the capillary pen 48 is moved by the CAD/CAM system 78 to provide the desired conductor pattern.

Figure 10:
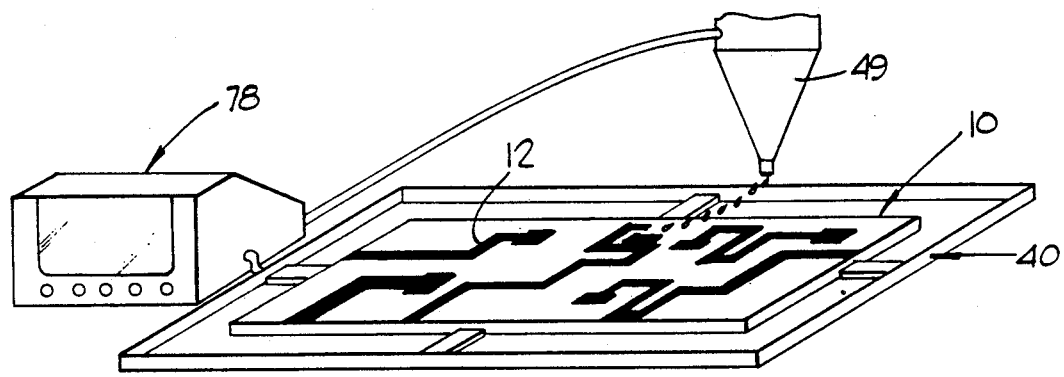
FIG. 10 is a schematic perspective view illustrating the printing of a conductor layer of a glass-based multilayer interconnect board subassembly with an ink-jet-type printing device.

Another method of applying a conductive layer 12 to a substrate layer 10 is illustrated in FIG. 10 in which an "ink-jet" type printing device 49 is used in association with a CAD/CAM-controlled XY table 40 to print a desired conductor pattern.

After the conductive layer 12 is printed onto the substrate layer 10, this subassembly 100, FIG. 1, is placed in a drying oven at approximately 120° C. for approximately 25 minutes. Next, subassembly 100 is placed in a firing furnace which is slowly ramped up to and down from a temperature of between 890° C. and 910° C. The entire firing cycle lasts approximately 1 hour, with the peak temperature being maintained for approximately 5 to 12 minutes. During the firing process, certain physical and chemical reactions occur which cause the conductive layer 12 to be transformed from a semi-liquid or paste state into a solid state.

Next, as illustrated in FIG. 5, a continuous dielectric layer 50 is applied in overlying relationship with the conductor layer 12 and substrate 10. In one preferred embodiment of the invention, which is presently the best mode contemplated, the dielectric layer 50 is applied by a silk-screening process, FIG. 11, in which the screen 51 is devoid of masked areas within the confines of the entire substrate 10. Screen 51 is positioned above the conductive layer 12 and substrate 10 and the dielectric material is applied therethrough in the same manner as described above with respect to the silk-screening of the conductive layer. Since the screen 51 contains no masked areas therein, a continuous dielectric layer 50 is provided, essentially covering the entire substrate.

Figure 11:
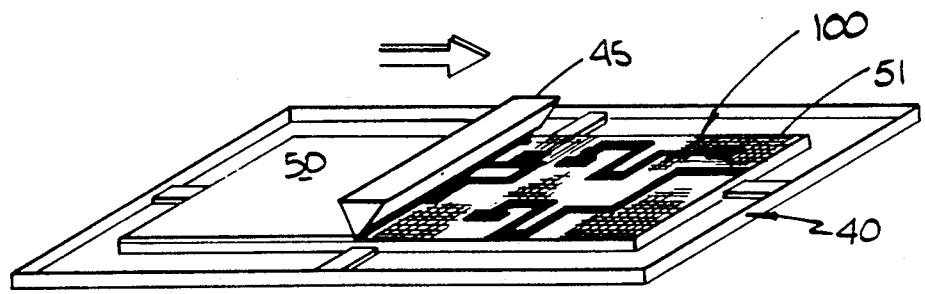
FIG. 11 is a schematic perspective view illustrating silk-screen printing of a continuous dielectric layer of a multilayer interconnect board subassembly.
Figure 12:
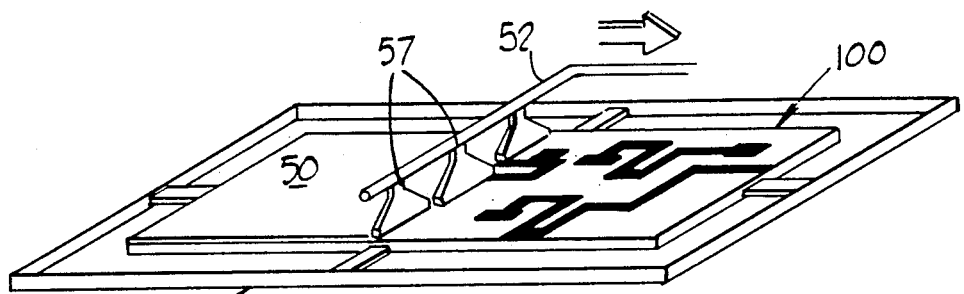
FIG. 12 is a schematic perspective view illustrating spray coating of a continuous dielectric layer of a multilayer interconnect board subassembly.

As illustrated schematically in FIG. 12, an alternate method for providing a continuous dielectric layer 50 is by spray coating. In this embodiment, a spray assembly comprising a displaceable spray arm conduit 53 having a plurality of spray heads 57 thereon is moved in a longitudinal pattern above the surfaces of the substrate and conductive layer 12. The dielectric material is provided at a rate dependent upon the speed of movement of the spray arm 53 to provide a predetermined dielectric layer thickness. The dielectric layer 50 may be provided in a single pass or in multiple passes of the spray assembly. In the embodiments of FIGS. 11 and 12, the same XY table 40 used to position the substrate 10 during conductor printing may be used to locate the MIB subassembly 100 relative to the dielectric material applicator 45 or 52, 57. However, since no precise registration between dielectric applicator and points on the subassembly 100 is required, the alignment between applicator and subassembly 100 need not be precise.

Figure 13:
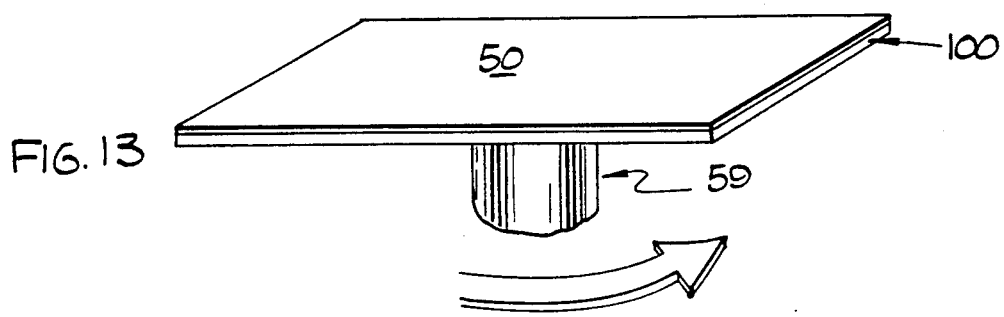
FIG. 13 is a schematic perspective view illustrating spin coating of a continuous dielectric layer of a multilayer interconnect board subassembly.

In yet another embodiment, as illustrated schematically in FIG. 13, the dielectric layer is provided by spin coating. In this embodiment, the subassembly 10 is mounted on a rotating table 59. Dielectric material of a predetermined volume is applied at the center of the substrate and conductive layer subassembly and is caused to be evenly distributed across the surface thereof by centrifugal force associated with the rotation of table 59. There are a variety of other methods known to those having skill in the art which could be employed to achieve this same objective, i.e. a continuous controlled thickness deposition of a dielectric layer.

Next, the dielectric layer is dried and fired by placing it in an oven and then a furnace for predetermined periods of time. For a typical dielectric layer of 2 to 5 mils (50 to 125 microns), a drying period may be approximately 30 minutes at an oven temperature of approximately 120° C., followed by a firing cycle similar to that for the conductor layer described above.

Figure 14:
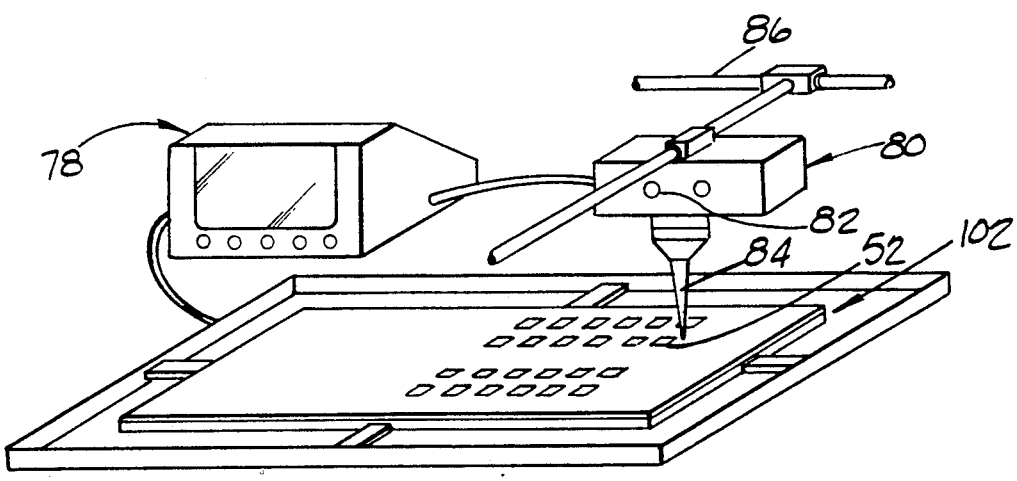
FIG. 14 is a schematic perspective view illustrating use of a laser cutting device to drill vias through a dielectric layer of a multilayer interconnect board subassembly.

Next, as illustrated in FIGS. 6 and 14, vias 52 are laser drilled through the dielectric layer 50 in regions immediately above predetermined pad areas 13 of the first conductive layer 12. Prior to laser drilling of the vias, a glass-based MIB subassembly 102 consisting of the ceramic substrate 10, first conductive layer 12, and first dielectric layer 50 is positioned on an XY table 40 which precisely locates the subassembly with respect to a laser cutting device 80. Next, the laser light wavelength is set, e.g. by adjusting light frequency dial 82 or by selecting a laser system having the appropriate light wavelength characteristics, to provide a laser beam 84 having a light frequency which is primarily reflected by the conductive layer 12 and which is primarily absorbed by the dielectric layer 50. The XY table is then adjusted through use of CAD/CAM system 78 to position a pad region 13 of the conductor layer 12 directly below the laser 80. The laser is then energized and a laser beam 84 is pulsed on the surface 21 of the dielectric layer 50 until a via hole 52 is bored through the dielectric layer to expose the pad region 13 of the conductive layer 12. In a typical embodiment in which a via 52 has a dimension of 8 mils by 8 mils (200 microns by 200 microns) and in which the laser beam 84 at the focal point thereof has a diameter of approximately 1 mil (25 microns), it is necessary to move the XY table back and forth in the X direction in a series of overlapping passes which are displaced incrementally in the Y direction, in order to achieved the desired cut. In a slightly different embodiment of the invention, the laser cutting device 80 is mounted on a suitable CAD/CAM-controlled displacement assembly 86 while the substrate first conductive layer and first dielectric layer subassembly 100 is held in a fixed position The laser cutting device 80 is then moved in a raster-type motion in order to provide a via hole of the desired dimensions. In one preferred embodiment of the invention in which the conductive layer 12 comprises a copper-to-glass mix of approximately 98 to 2, it was found that a laser light wavelength of 1064 nanometers and a laser power setting of 6 watts in a YAG (Yttrium Alumina Garnet) type laser cutting device, such as that sold under the product designation Model 44 by Electro Scientific Industries (ESI), Inc. 13900 N.W. Science Park Drive, Portland, Oreg., 97229-5497, was capable of producing a via hole in the dielectric layer 50 without significantly damaging the conductive layer 52. The laser may be used in this manner to bore each of the vias required in the first dielectric layer 50.

Figure 7:
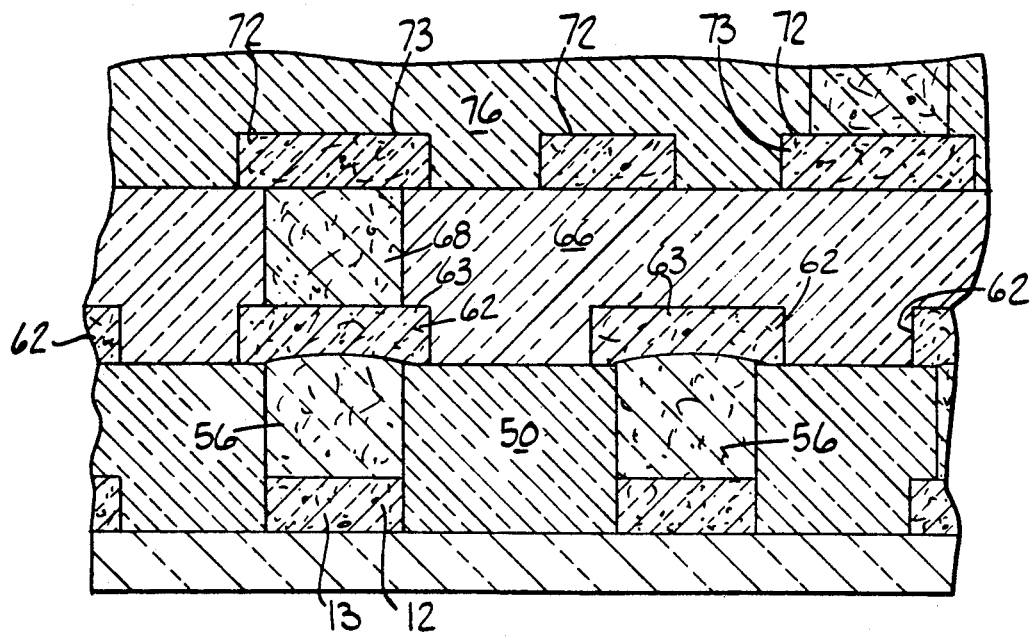
FIG. 7 is a schematic, cross sectional elevation view of a substrate layer; first, second and third conductor layers; and first, second and third dielectric layers with via fill of a glass-based multilayer interconnect board subassembly.

Next, as illustrated in FIG. 7, the vias 52 are filled with conductive material 56 which may comprise a conductive paste very similar to that used to provide conductive layer 12. The physical and mechanical properties of conductive material 56 are again very similar (in the fired state) to those of dielectric material 50.

The filling of vias may be accomplished by any method which allows precise registration between the vias and the apparatus dispensing the conductive material. Thus, in one embodiment, the vias are filled using a silk-screening technique similar to that illustrated in FIG. 8 in which all areas of the screen, except the areas immediately above the vias, have been masked. In another embodiment, an ink jet-type spray head is positioned above an XY table which is moved in the same manner as it was moved during laser cutting to position the ink jet head above each via to be filled.

In an embodiment of the invention, which is presently the best mode contemplated, after filling of the vias, the glass-based multilayer interconnect board subassembly thus formed is dried and transported to a firing oven for a predetermined period of time to fire the via fill material. (In another embodiment of the invention, the vias are fired at the same time as the firing of an overlying conductive layer.)

After filling of the vias, as further illustrated by FIG. 7, a second conductive layer 62 of a predetermined configuration is provided over the first dielectric layer 50 and conductive material-filled vias 56. Predetermined pad regions 63 of the second conductive layer 62 are positioned in conductively connected relationship with the underlying vias 56, thereby conductively connecting the first circuit layer 12 with the second circuit layer 62.

After application of the second conductive layer, the multilayer interconnect board subassembly is again dried and transported to a firing oven where the second conductive layer is fired.

A second dielectric layer 66 is thereafter applied, dried and fired in the same manner as described above with respect to the first dielectric layer 50, and a second set of vias is thereafter formed in the second conductive layer by the same laser drilling technique as described above with respect to the first layer. These vias are thereafter filled, dried and fired in the same manner as described above with respect to the vias in the first layer. This process is repeated for each successive strata of conductive layers and dielectric layers until the glass-based multilayer interconnect board is completed.

Figure 4:
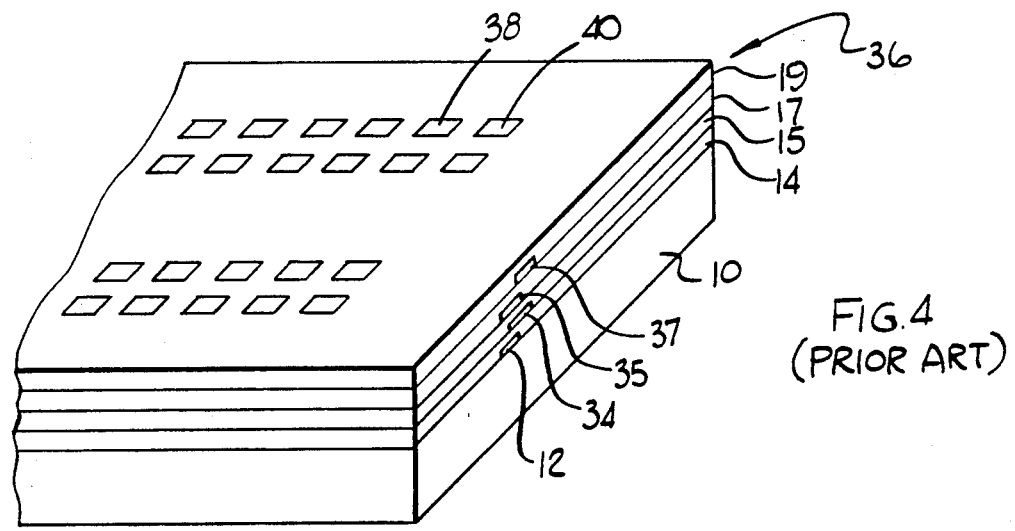
FIG. 4 is a schematic perspective view of a cross sectioned end portion of a glass-based multilayer interconnect board subassembly.

Thus, a glass-based MIB may be formed, using the method of the present invention, which is identical to a glass-based MIB, e.g. 36, FIG. 4, formed by conventional industry processes. However, using the method of the present invention, production time and expense may be considerably decreased.

While an illustrative and presently preferred embodiment of the invention has been described in detail herein, it is to be understood that the inventive concepts may be otherwise variously embodied and employed and that the appended claims are intended to be construed to include such variations except insofar as limited by the prior art.

What is claimed is:

1. A method of boring holes for electrical interconnections in a multilayer interconnect circuit board assembly of the type having a first layer of electrically conductive glass matrix material for transmission of electrical signals and which is primarily reflective of light of a first light wavelength, and having a second layer of dielectric glass matrix material, overlying said first layer of electrically conductive glass matrix material, which is primarily absorptive of light of said first light wavelength, comprising:
   a) tuning the frequency of a laser cutting device to said first light wavelength;
   b) directing a laser beam from said tuned laser cutting device onto said second layer of dielectric glass matrix material in a region where an electrical interconnect via hole is to be provided therethrough;
   c) using said laser beam from said tuned laser cutting device to bore said via hole through said second layer of dielectric glass matrix material and terminating at said first layer of electrically conductive glass matrix material, wherein said laser beam is substantially reflected by said first layer of electrically conductive glass matrix material upon interface therewith; and
   d) terminating application of the said beam after said reflective interface of said laser beam with said first layer of electrically conductive glass matrix material.

2. The method of claim 1 wherein said electrically conductive glass matrix material comprises copper particles embedded in a glass matrix in a ratio of between 75 to 25 copper to glass and 98 to 2 copper to glass.

3. A method for providing a via hole for electrical interconnecting substantially through a predetermined portion of a multilayer interconnect board comprising the steps of:
   a) applying a layer of electrically conductive glass matrix material in a predetermined pattern on a substrate layer for electrical transmission of signals, said electrically conductive glass matrix material comprising metal particles embedded in a glass matrix;
   b) applying a layer of dielectric material, comprising a glass matrix, in an overlying relationship with said layer of electrically conductive glass matrix material;
   c) tuning a laser cutting device to a light wavelength which is primarily reflected by said metal particles in said electrically conductive glass matrix layer;
   d) directing a laser beam from said tuned laser cutting device onto a region of said dielectric glass matrix layer overlying a portion of said electrically conductive glass matrix layer;
   e) using said laser beam from said tuned laser cutting device to bore the via hole through said layer of dielectric glass matrix material and terminating at said layer of electrically conductive glass matrix material, wherein said laser beam is substantially reflected by said layer of electrically conductive glass matrix material upon interface therewith; and
   f) terminating application of said laser beam after said reflective interface of said laser beam with said electrically conductive glass matrix material.

4. The method of claim 3 wherein the step of applying said dielectric glass matrix layer comprises applying said dielectric glass matrix layer in a continuous coating to said electrically conductive glass matrix layer.

5. The method of claim 4 wherein the step of applying said dielectric glass matrix layer comprises utilizing only a single drying and heating period to fire said dielectric glass matrix layer.

6. The method of claim 3 wherein said step of applying a layer of dielectric glass matrix material comprises a silk-screen printing process.

7. The method of claim 3 wherein:
said step of directing a laser beam comprises directing a laser beam onto a plurality of regions of said dielectric glass matrix layer overlying a portion of said electrically conductive glass matrix layer; and
said step of using said laser beam comprises using said laser beams to bore a plurality of via holes through said layer of dielectric glass matrix material and terminating at said layer of electrically conductive glass matrix material.

8. The method of claim 3, further comprising controlling said steps of directing a laser beam, using said laser beam, and terminating application of said laser beam with a CAD/CAM system.

9. A method for forming a portion of a multilayer interconnect board comprising the steps of:
a) providing an electrical conductor material comprising copper particles embedded in glass matrix in a ratio of between 75 to 25 copper to glass and 98 to 2 copper to glass;
b) printing the electrical conductor material in a predetermined first conductor pattern for electrical transmission of signals and which is between 0.0005 inches thick and 0.004 inches thick on an underlying layer of material;
c) providing a glass-based dielectric material;
d) covering the first conductor pattern with a layer of the glass-based dielectric material having a layer thickness of between 0.0005 inches and 0.007 inches;
e) tuning a laser cutting device to approximately the same wavelength as light which is reflected from copper;
f) directing light from the tuned laser cutting device onto the layer of glass-based dielectric material in a selected region thereof overlying the first conductor pattern where an electrical interconnecting via is to be provided through the glass-based dielectric layer;
g) using the light from the tuned laser cutting device to bore the via through the glass-based dielectric material and terminating at the first conductor pattern, wherein the light is substantially reflected by the first conductor pattern upon interface therewith;
h) terminating application of the light after the reflective interface of the light with the first conductor layer;
i) filling the via in the glass-based dielectric layer with a conductive material for electrical interconnection with the first conductor pattern; and
j) providing a second conductor pattern on an exposed surface portion of the layer of glass-based dielectric material and in conductive connection with the conductive material in the via for providing an electrical interconnection between the first and second conductor patterns.

* * * * *

UNITED STATES PATENT AND TRADEMARK OFFICE
CERTIFICATE OF CORRECTION

PATENT NO. : 5,108,785
DATED : April 28, 1992
INVENTOR(S) : LINCOLN et al.

It is certified that error appears in the above-identified patent and that said Letters Patent is hereby corrected as shown below:

Column 1, line 14, please delete "a" and insert therefor -- as --.

Column 4, line 61, please delete "8" and insert therefor -- 98 --.

Column 5, line 2, please delete ":" and insert therefor -- ; --.

Signed and Sealed this

Twenty-first Day of June, 1994

Attest:

BRUCE LEHMAN

*Attesting Officer*      *Commissioner of Patents and Trademarks*